(12) United States Patent
Takeda

(10) Patent No.: US 11,901,378 B2
(45) Date of Patent: Feb. 13, 2024

(54) PHOTODETECTOR

(71) Applicant: Nippon Telegraph and Telephone Corporation, Tokyo (JP)

(72) Inventor: Kotaro Takeda, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 300 days.

(21) Appl. No.: 17/423,045

(22) PCT Filed: Jan. 14, 2020

(86) PCT No.: PCT/JP2020/000915
§ 371 (c)(1),
(2) Date: Jul. 14, 2021

(87) PCT Pub. No.: WO2020/149264
PCT Pub. Date: Jul. 23, 2020

(65) Prior Publication Data
US 2022/0077202 A1 Mar. 10, 2022

(30) Foreign Application Priority Data
Jan. 16, 2019 (JP) .................. 2019-005532

(51) Int. Cl.
*H01L 27/144* (2006.01)
*H01L 31/028* (2006.01)
*H01L 31/103* (2006.01)

(52) U.S. Cl.
CPC ........ *H01L 27/1443* (2013.01); *H01L 31/028* (2013.01); *H01L 31/103* (2013.01)

(58) Field of Classification Search
CPC . H01L 27/1443; H01L 31/028; H01L 31/103; H01L 31/02019; H01L 31/105; G01J 1/02; G01J 1/42
See application file for complete search history.

(56) References Cited

U.S. PATENT DOCUMENTS 4,303,861 A * 12/1981 Ekstrom ............. H01L 27/1446
257/E27.129
2004/0245592 A1* 12/2004 Harmon ................ G01J 1/4228
257/E27.128

(Continued)

FOREIGN PATENT DOCUMENTS

JP       2015-153899 A    8/2015
WO    WO-2012052542 A1 *  4/2012    ....... H01L 31/02008

OTHER PUBLICATIONS

K. Takeda et al., "Contributions of Franz-Keldysh and Avalanche Effects to Responsivity of a Germanium Waveguide Photodiode in the $\hbox{L}$-Band," in IEEE Journal of Selected Topics in Quantum Electronics, vol. 20, No. 4, pp. 64-70, Jul.-Aug. 2014 (Year: 2014).*

(Continued)

*Primary Examiner* — Sitaramarao S Yechuri
(74) *Attorney, Agent, or Firm* — Workman Nydegger

(57) ABSTRACT

A problem to be solved is to prevent deterioration of a signal-to-noise ratio. A photodetector according to the present invention is a germanium photodetector (Ge PD) that uses germanium or a germanium compound in a light absorption layer, the photodetector including a resistor connected in series with a cathode or an anode of the Ge PD; and a capacitor connected at one end to a connection point between the resistor and a cathode or anode of the Ge PD and grounded at another end, another connection point of the resistor being connected to a bias power supply, wherein to withstand maximum operating optical input power, the value of the resistor is determined such that electric power applied to the Ge PD will be lower than a breakdown threshold.

8 Claims, 10 Drawing Sheets

(56) References Cited

U.S. PATENT DOCUMENTS

2011/0095388 A1* 4/2011 Richter ................ H01L 31/107
                                                         257/E31.127
2016/0155863 A1* 6/2016 Baehr-Jones ..... H01L 27/14649
                                                         438/69

OTHER PUBLICATIONS

G. G. Macfarlane et al., *Fine Structure in the Absorption-Edge Spectrum of Ge*, Physical Review, vol. 108, No. 6 (1957), pp. 1377-1383.

* cited by examiner

PHOTODETECTOR

TECHNICAL FIELD

The present invention relates to a photodetector used in an optical communications system and an optical information processing system, and more particularly, to a photodetector that uses germanium.

BACKGROUND ART

With the recent spread of optical communications, there has been demand for cost reduction of optical communications devices.

One of solutions to this is forming an optical circuit of an optical communications device on a large-diameter wafer such as a silicon wafer, using a microoptical circuit technique such as silicon photonics. This dramatically reduces material costs per chip, making it possible to reduce the costs of optical communications devices.

A typical photodetector formed on a silicon (Si) substrate that uses such a technique is a germanium photodetector (Ge PD) that lends itself to monolithic integration. FIG. 1 is a diagram schematically showing a structure of a conventional waveguide-coupled vertical Ge PD. FIG. 2 is a sectional view taken along line II-II in FIG. 1. Note that in FIG. 1, to make it easier to understand the structure, an upper clad layer 103 and electrodes 116 to 118 shown in FIG. 2 are omitted and that the electrodes 116 to 118 are indicated by rectangles only at positions where the electrodes 116 to 118 are put in contact with silicon electrode units 112 and 113 implanted with first impurities and a Ge region 115 implanted with second impurities.

The Ge PD is formed on a silicon-on-insulator (SOI) substrate made up of a Si substrate, a Si oxide film, and a surface Si layer, using lithography technology or the like. The Ge PD 100 shown in FIG. 2 includes a Si substrate 101, a lower clad layer 102 including a Si oxide film on the Si substrate, a core layer 110 configured to introduce signal light, a Ge layer 114 formed on the core layer 110 and configured to absorb light, and an upper clad layer 103 formed on the core layer 110 and the Ge layer 114.

As shown in FIG. 1, the core layer 110 is divided into a waveguide layer 1101 and a silicon slab 1102.

A Si slab 111 implanted with the first impurities as well as silicon electrode units 112 and 113 doped with a high concentration of the first impurities and configured to act as electrodes are formed on the silicon slab 1102. The Ge layer 114 is deposited by epitaxial growth and the Ge region 115 doped with second impurities is formed on top of the layer 114. The Ge layer 114 may be a layer containing a germanium compound. The electrodes 116 to 118 are provided on the silicon electrode units 112 and 113 and the Ge region 115 by being placed in contact with them.

When light entering the silicon slab 1102 through the waveguide layer 1101 is absorbed by the Ge layer 114, photocurrents flow between the electrode 117 and the electrode 116 as well as between the electrode 117 and the electrode 118, and the Ge PD detects the light by detecting the photocurrents.

Besides the Ge PD such as shown in FIGS. 1 and 2, there are also horizontal Ge PDs such as shown in FIGS. 3 and 4. The horizontal Ge PD of FIG. 3 includes a germanium region 121 implanted with the first impurities and a germanium region 122 implanted (by ion implantation) with the second impurities instead of including the p-type Si slab 111 implanted with the first impurities (e.g., a p-type semiconductor) and the Ge region 115 doped with the second impurities (e.g., an n-type semiconductor). The horizontal Ge PD of FIG. 4 includes a silicon region 131 implanted with the first impurities, a silicon region 132 implanted with the second impurities, and a silicon electrode unit 133 doped with a high concentration of the second impurities and configured to act as an electrode instead of including the p-type Si slab 111 implanted with the first impurities and the Ge region 115 doped with the second impurities. In a region 123 between the silicon region 131 and the silicon region 132, the Ge layer 114 is placed in contact with the core layer 110. The Ge layer 114 may be a layer containing a germanium compound instead of being a layer containing germanium.

The Ge PD 100 shown in FIGS. 2, 3, and 4 has the property that temperature characteristics of sensitivity (characteristics of current output in response to optical input power; unit is A/W) is not constant.

FIG. 5 shows wavelength dependence of sensitivity of a Ge PD at reverse bias voltage of 1.6 V in the communications wavelength: C-band and L-band ranging from 1530 to 1625 nm.

For example, at 31 degrees C., almost constant sensitivity is exhibited up to around the C-band, but the sensitivity decreased in the L-band. The sensitivity change is caused by changes in the optical absorption spectrum of germanium. At −5 degrees C., the sensitivity tends to decrease even in the C-band. FIG. 6 shows temperature dependence of the optical absorption spectrum of germanium (Non-Patent Literature 1), where the abscissa and the ordinate represent photon energy and the square root of an absorption coefficient k, respectively. When the temperature lowers, a band gap of germanium shifts to a high energy side. Therefore, an edge of the optical absorption spectrum shifts to a short wavelength side. The edge of the optical absorption spectrum of germanium used for the Ge PD is just around 1565 nm on the long wavelength side of the C-band at 31 degrees C. Therefore, at 31 degrees C., even though the Ge PD exhibits constant sensitivity over the entire C-band, the sensitivity decreases gradually with decreases in the temperature, starting from the long wavelength side. This tendency is shown in FIG. 5, in which at a low temperature of −5 degrees C., the sensitivity tends to decrease with increases in wavelength.

Decreases in sensitivity mean deterioration of a signal-to-noise ratio when an input signal is weak, and thus cause a problem in that minimum light sensitivity in an optical communications system deteriorates. As a means of solving this problem, there is a means to apply a high voltage to the Ge PD (Patent Literature 1).

CITATION LIST

Patent Literature

Patent Literature 1: Japanese Patent Laid-Open No. 2015-153899

Non-Patent Literature

Non-Patent Literature 1: Macfarlane G. G., T. P. McLean, J. E. Quarrington and V. Roberts, Phys. Rev. 108, 6 (1957) 1377-1383.

SUMMARY OF THE INVENTION

Technical Problem

A drive method described in Patent Literature 1 provides a Ge PD having high sensitivity even in the L-band in cold temperatures, but it requires to apply a voltage of about 7 to 12 V, which is higher than voltages used typically, when the thickness of the Ge layer is about 1 μm. The application of a high voltage leads to a reduction in the maximum allowable optical input power. Generally, when electric power, given by the product of a photocurrent and an applied voltage, exceeds a certain value, germanium is broken by heat produced by the electric power, and the Ge PD inoperative. Because the photocurrent is proportional to the optical input power, when light with high optical input power is entered in the Ge PD, a breakdown threshold changes depending on the applied voltage. The breakdown power, which varies with Ge PD design, is generally 5 to 30 mW. Therefore, when a high voltage of 7 to 12 V is applied, an allowable current value is about 0.4 to 4 mA. If the sensitivity of the Ge PD is 1 A/W, an allowable value of optical input power is about 0.4 to 4 mW. However, in a system that adopts optical digital coherent communications technology that generally uses Ge PDs, the maximum input power is about 1 to 20 mW, and thus when the drive method described in Patent Literature 1 is adopted, there is a problem in that the maximum input power exceeds the breakdown threshold.

Means for Solving the Problem

To solve the above problems, the present invention is characterized by having the following configuration. As shown in FIG. 7, a resistor 202 is connected to a cathode of a Ge PD 200 and a power supply (DC) 201 is connected to another end of the resistor 202. One end of a capacitor 203 is connected to a connection point between the resistor 202 and the Ge PD 200, and another end is grounded.

An anode of the Ge PD 200, from which signals are taken, is connected with an IC such as a transimpedance amplifier or digital signal processor. A cathode side and the anode side may be reversed. To withstand maximum operating optical input power, the value of the resistor 202 is determined such that the electric power applied to the Ge PD will be lower than the breakdown threshold.

Effects of the Invention

According to the present invention, with a relatively high voltage of about 7 to 12 V applied to the Ge PD as a bias voltage, sensitivity is improved by the Franz-Keldish (FK) effect when optical input power is low, and a voltage equal to 7 to 12 V minus a voltage drop caused by resistance is applied to the Ge PD when optical input power is high, and consequently although sensitivity improvement due to the FK effect does not occur, the decrease in the applied voltage keeps applied power from reaching breakdown power. Thus, the present invention provides the effect of being able to prevent deterioration of the signal-to-noise ratio.

DESCRIPTION OF EMBODIMENTS

Forms of a photodetector according to the present invention will be described in detail below with reference to embodiments.

Embodiment 1

Figure 7:
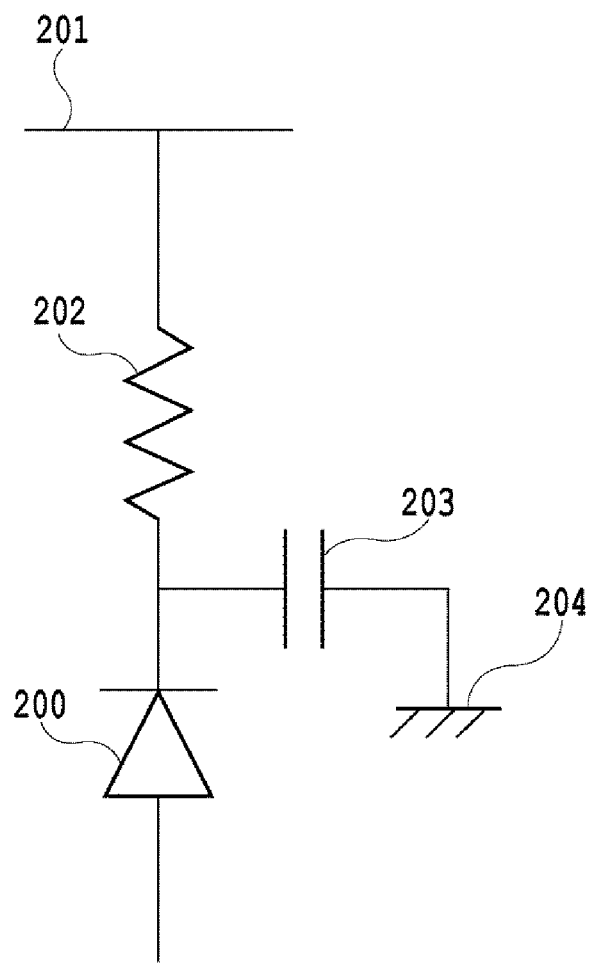
FIG. 7 is a diagram showing a configuration of a photodetector (Ge PD) according to the present invention.
Figure 8:
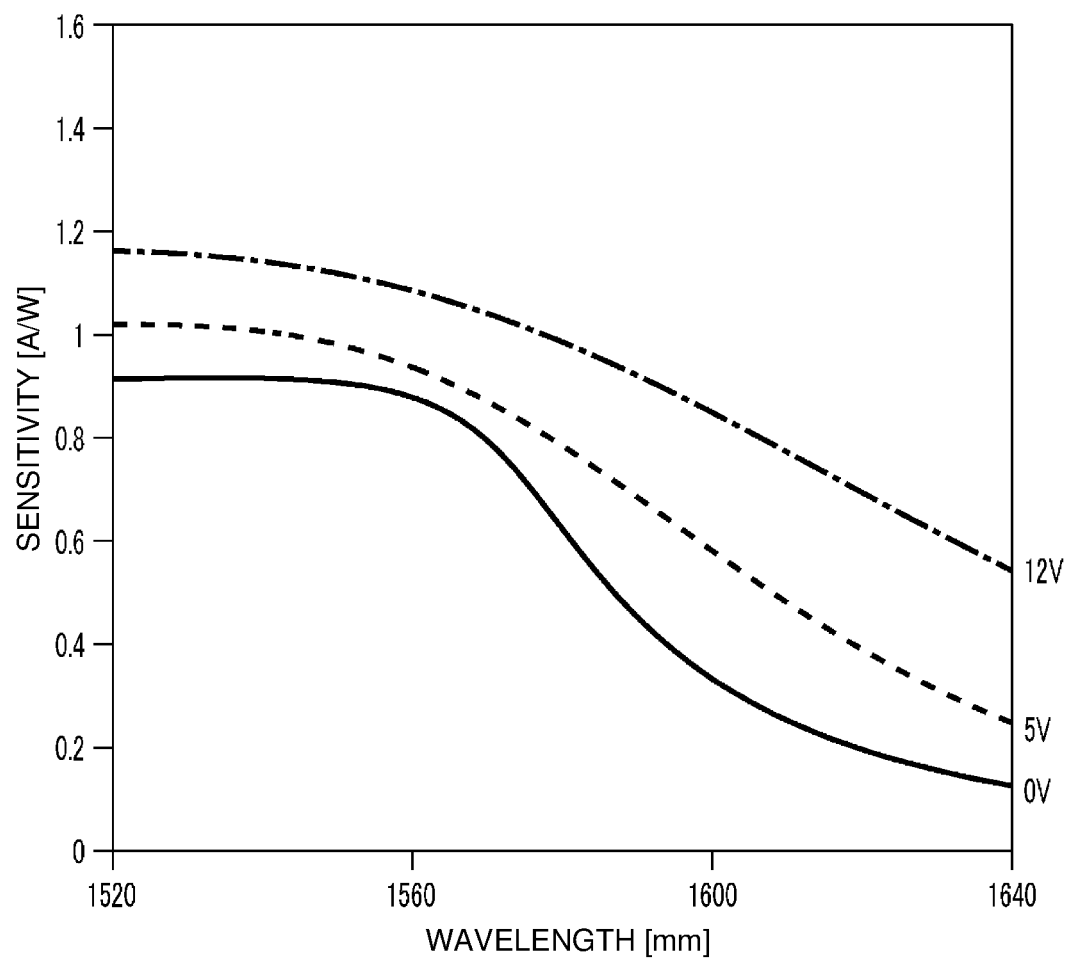
FIG. 8 is a diagram showing applied-voltage- and wavelength-dependence characteristics of sensitivity of the photodetector (Ge PD) according to the present invention.

As shown in FIG. 7, of the photodetector according to the present invention, a photodetector of the present embodiment is a germanium photodetector (Ge PD 200) that uses germanium or a germanium compound in a light absorption layer. The photodetector of the present embodiment includes a resistor 202 connected in series with a cathode or anode of the Ge PD 200 and a capacitor 203 connected at one end to a connection point between the resistor and the cathode or anode of the Ge PD and grounded at another end. Another connection point of the resistor is connected to a bias power supply. A concrete drive method for the photodetector will be described below. A power supply 201 applies a voltage to the Ge PD 200 through the resistor 202. The power supply 201 applies a relatively high voltage of about 7 to 12 V adopted by Patent Literature 1. Consequently, as shown in FIG. 8, the Ge PD changes sensitivity using the Franz-Keldish (FK) effect, and the sensitivity no longer deteriorates significantly even in the L-band. Because a photocurrent flows through the resistor 202 when optical input power increases, a voltage drop occurs in the resistor 202, decreasing the voltage applied to the Ge PD 200. Therefore, when the optical input power is low, a high voltage of about 7 to 12 V is applied to the Ge PD 200, and consequently the sensitivity is improved by the FK effect.

When the optical input power is high, a voltage equal to 7 to 12 V minus a voltage drop caused by the resistor 202 is applied to the Ge PD, and consequently although sensitivity improvement due to the FK effect does not occur, the decrease in the applied voltage keeps applied power from reaching breakdown power. Because high optical input power means a large signal component, even if the sensitivity is reduced, deterioration of the signal-to-noise ratio does not occur.

Also, when the resistor 202 is inserted, resistances of both the Ge PD 200 and the resistor 202 become visible from the side of the power supply 201, creating a new problem in that high-speed drive performance characteristics dependent on a CR time constant deteriorate, but the problem is solved if one end of the capacitor 203 is connected to the connection point between the resistor 202 and the Ge PD 200 and another end is grounded. For a DC signal, the capacitor 203, which has extremely high resistance, is ignored and a line running from the power supply 201 through the resistor 202 to the Ge PD 200 makes up a route. For an RF signal, because the capacitor 203 is passable, a line running from ground 204 through the capacitor 203 to the Ge PD 200 makes up a route. Therefore, the resistor 202 is invisible from the RF signal, and the influence of the resistor 202 can be excluded from the CR time constant. Thus, even if the resistor 202 is added, high-speed characteristics of the Ge PD 200 do not deteriorate.

Figure 1:
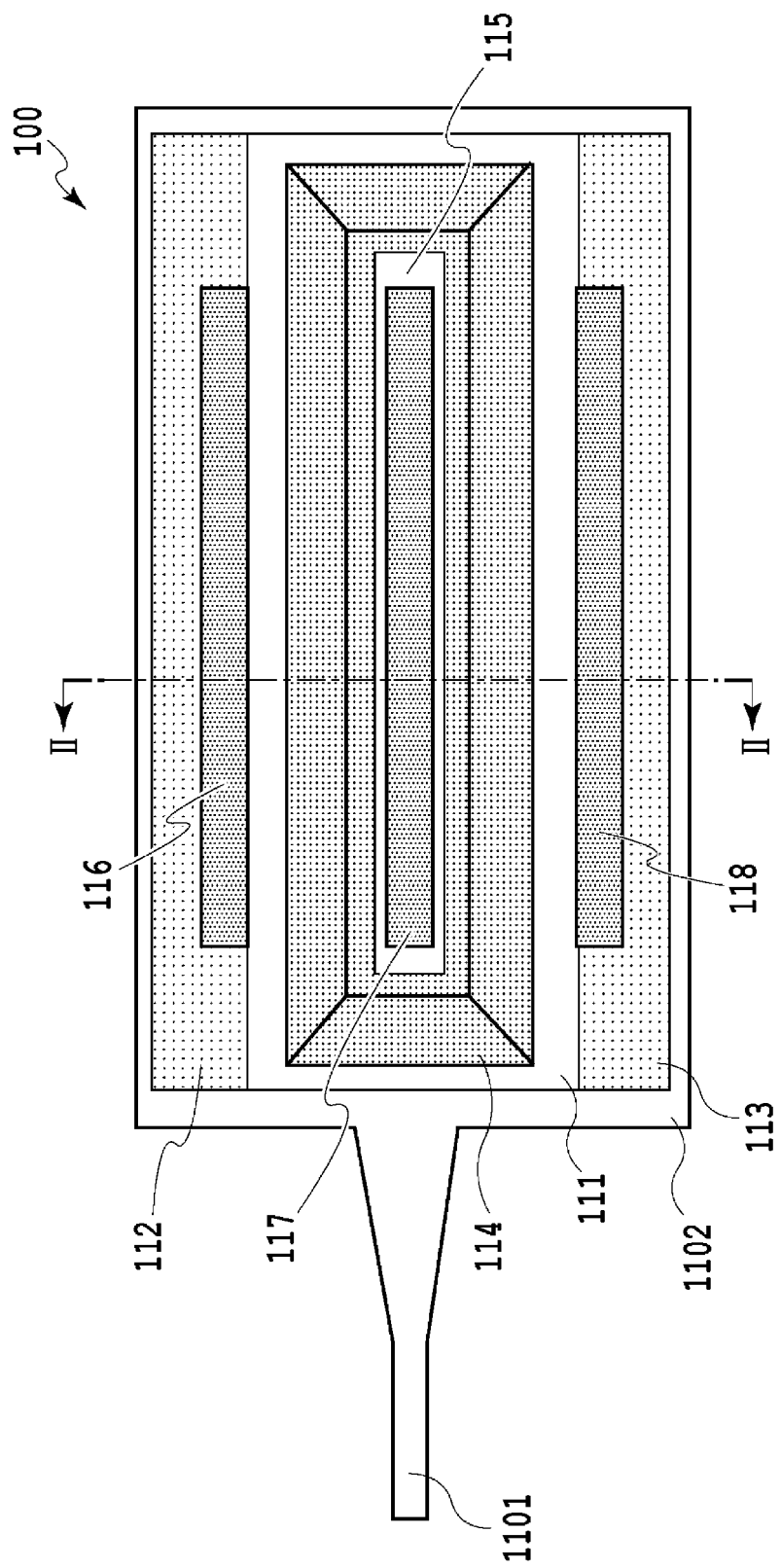
FIG. 1 is a diagram showing a typical vertical Ge PD.
Figure 9:
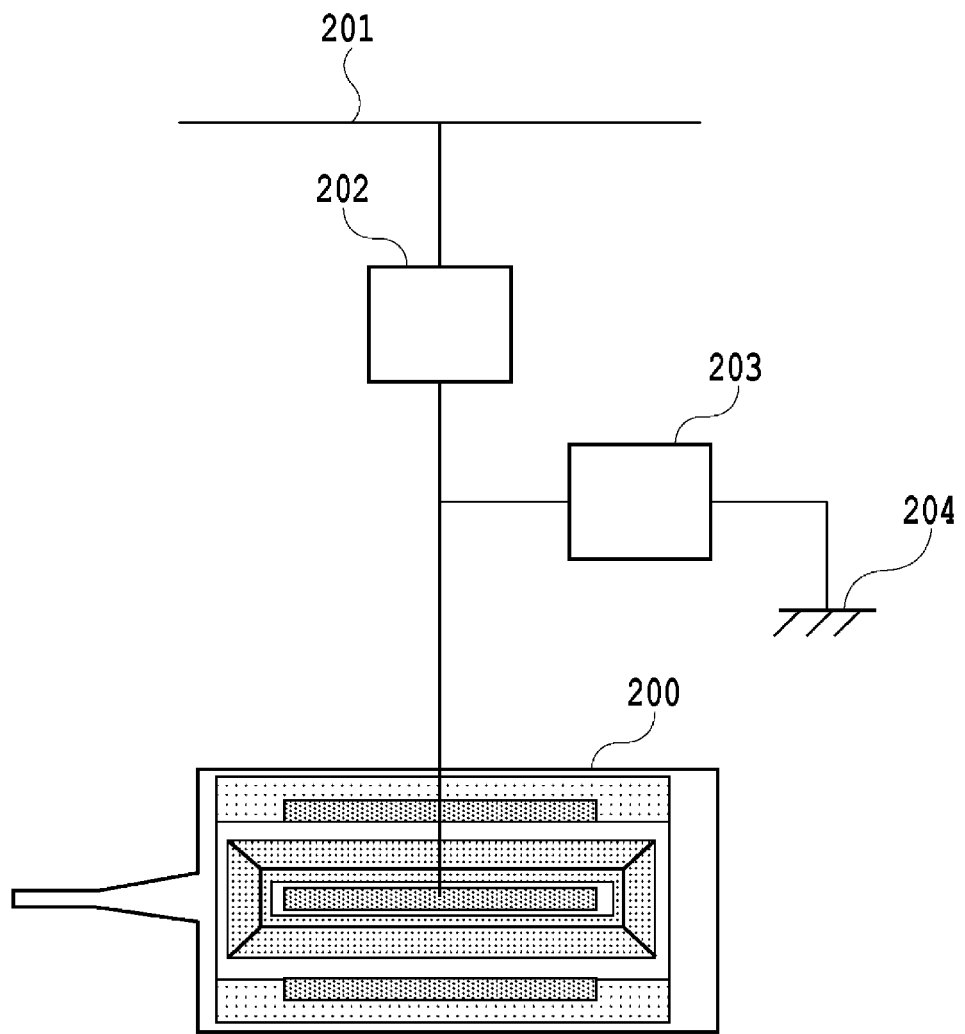
FIG. 9 is a diagram showing a configuration of a photodetector according to a first embodiment.

FIG. 9 is an example in which the Ge PD 200 according to the present invention shown in FIG. 7 is used instead of the Ge PD shown in FIG. 1 and the resistor 202 and the capacitor 203 are connected to the cathode. Signals are taken from the anode of the Ge PD 200. According to the present embodiment, the anode and the cathode may be reversed. The resistor 202 and the capacitor 203 may be external components such as a chip resistor or condenser, a resistor or capacitor created by implanting impurities onto a core layer (silicon core layer) 110, or a resistor or capacitor created from metal or a metal compound embedded in an upper clad layer.

The voltage applied to the power supply 201 is 7 to 12V when a Ge layer is about 1 μm thick, and the value of the voltage to be applied varies with the thickness of a depletion layer in the Ge layer. Therefore, it is right to express what is to be applied in terms an electric field, and the electric field applied to the depletion layer is 15 to 30 kV/mm.

An example will be described below using specific values. Here, for the sake of simplicity, it is assumed that the thickness of Ge is 1 um, the thickness of the depletion layer is 400 to 500 nm, and the voltage to be applied is 7 to 12V. The breakdown power of the Ge PD, which varies with Ge PD design, is generally 5 to 30 mW. Thus, when a high voltage of 7 to 12 V is applied, the allowable current value is about 0.4 to 4 mA. If the sensitivity of the Ge PD is 1 A/W, the allowable value of optical input power is about 0.4 to 4 mW. Since the maximum input power is about 1 to mW in a system that adopts optical digital coherent communications technology, it is necessary to determine the value of the resistor 202 such that the electric power applied to the Ge PD will be lower than the breakdown threshold when input power in this range is applied. If the sensitivity is 1 A/W, when 20 mW is applied, the photocurrent is 20 mA and the applied power can be lower than a minimum value of the breakdown power of 5 mW when the applied voltage is 0.25 V. Thus, a resistance value R of the resistor 202 is 0.25=Vbias−R×Iphoto, where Vbias is the voltage (7 to 12 V in this case) applied to the PD and Iphoto is an input photocurrent (20 mA in this case) from the system. The value of R determined from this is 337.5Ω when Vbias is 7V, and 587.5Ω, when Vbias is 12 V.

Vbias of 7 to 12V is far greater than a typical drive bias and the resistance value of 337.5 to 587.5Ω is far smaller than typical load resistance.

This is fit into a general expression as follows. When depletion layer thickness is l, Vbias is given by E×l=Vbias, where E is an electric field to be applied to the depletion layer and is 15 to 30 k V/mm in the case of a Ge PD.

If the maximum rated optical input current of the system is Iphoto_AM, the maximum operating optical input current is Iphoto_M, the sensitivity is M, the maximum optical input power rating of the system is Pphoto_AM, and the maximum operating optical input power is Pphoto_M, Iphoto_AM=M×Pphoto_AM Iphoto_M=M×Pphoto_M If the breakdown power of the Ge PD is Pbreak, the applied voltage Vmax which the Ge PD can withstand at the maximum input light power rating is Vmax=Pbreak/Iphoto_AM Here, if the resistance value is RAM Vmax=Vbias−RAM×Iphoto_AM Thus,

[Math. 1]

$$RAM = \left(El - \frac{Pbreak}{M\ Pphoto\_AM}\right)\left(\frac{1}{M\ Pphoto\_AM}\right)$$

RAM derived from the expression is the value of the resistor 202 which the Ge PD can withstand at the maximum optical input power rating.

Similarly, if the voltage to be applied to the Ge PD 200 when the maximum operating input light power is received is V_M (an appropriate range is 1 to 3 V) and the resistance value at this time is RM, V_M=Vbias−RM×Iphoto_M Thus,

[Math. 2]

$$RM = (El - V\_M)\left(\frac{1}{M\ Photo\_M}\right)$$

RM derived from the expression is the value of the resistor 202 which the Ge PD can withstand when the maximum operating optical input power is received.

The value of the resistor 202 is between RAM and RM, both inclusive. When the value of the resistor 202 is larger than RAM, the voltage V=Vbias−R×Iphoto applied to the Ge PD 200 becomes zero before the maximum optical input power rating is reached, and thus the power applied to the Ge PD 200 does not exceed the breakdown power. On the other hand, if R is high, the voltage V applied to the Ge PD 200 becomes zero even if the maximum optical input power is not exceeded. To avoid a situation in which a sufficient reverse bias fails to be applied to the Ge PD 200 at input power equal to or lower than the maximum operating optical input power, desirably the value of the resistor 202 is smaller than RM. The voltage to be applied to the PD at the maximum operating optical input power is V_M.

The depletion layer thickness l, sensitivity M, breakdown power Pbreak of the Ge PD 200, maximum optical input power rating PphotoAM of the system, and maximum operating optical input power PphotoM of the system are all matters determined based on the design of the Ge PD 200 and specifications of the system, and depend on the structure and processes of the Ge PD and configuration of the system. On the other hand, the electric field E is a value dependent on physical properties of germanium or a germanium compound, and 15 to 30 kV/mm is required in order to produce the FK effect to such an extent as to ensure sufficient sensitivity. According to the present invention the value of resistance is determined using the value of the electric field E as a restrictive condition.

Embodiment 2

Figure 2:
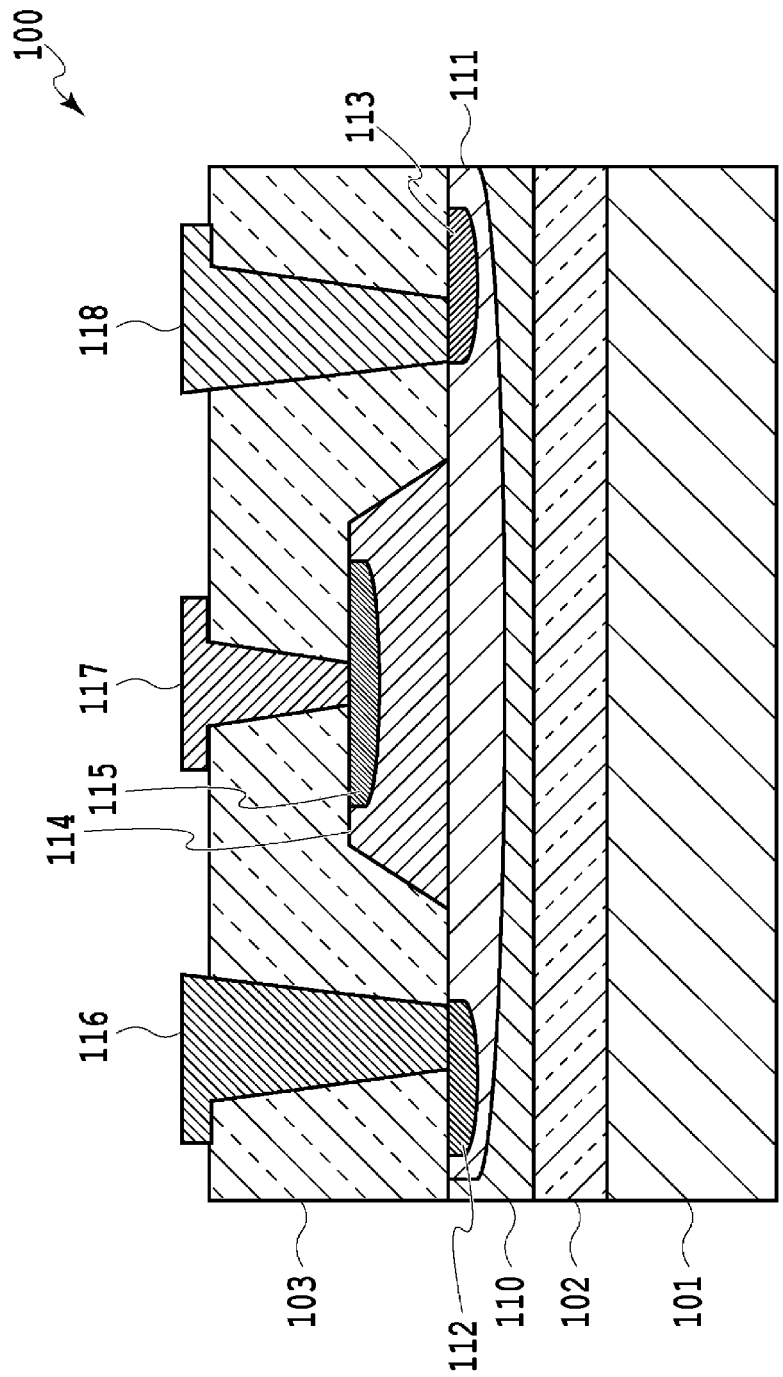
FIG. 2 is a diagram showing a sectional structure of the Ge PD of FIG. 1.
Figure 3:
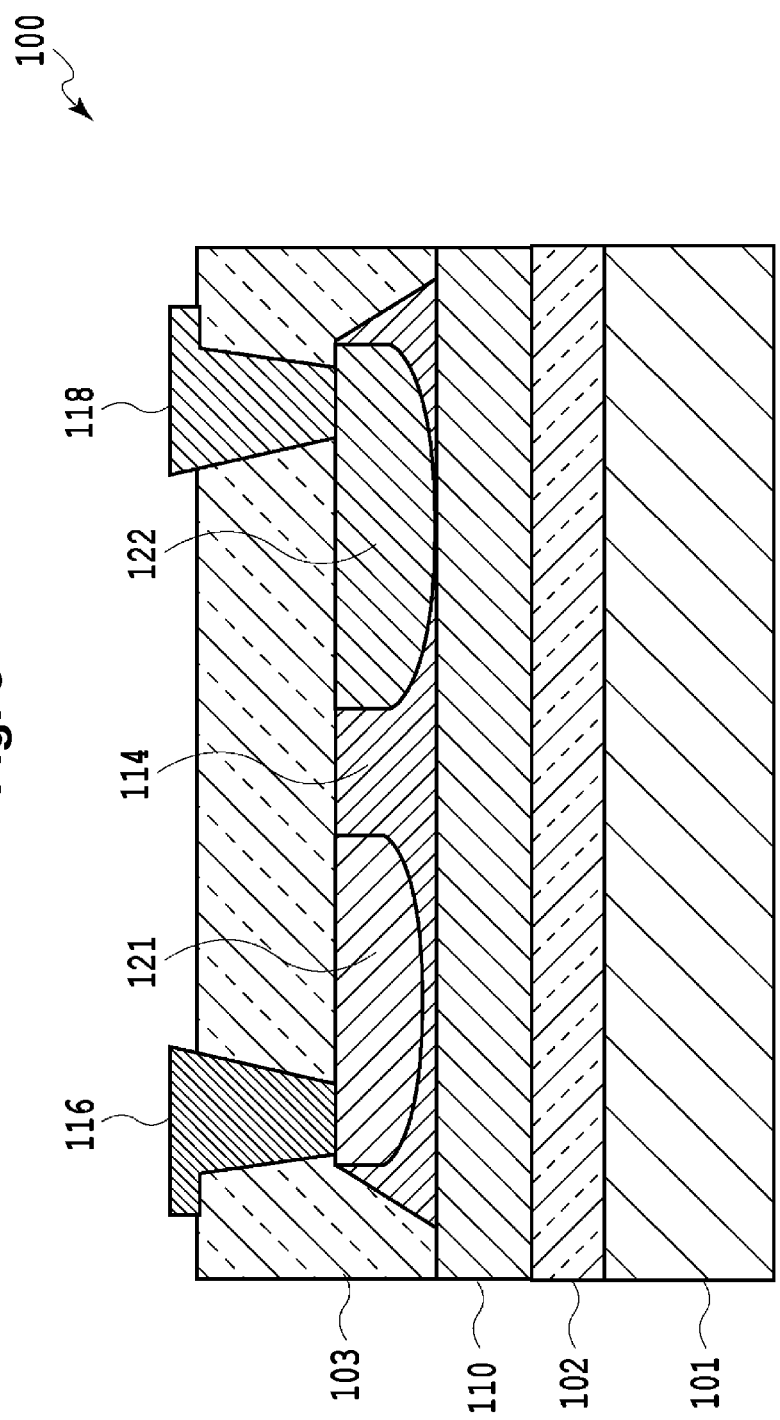
FIG. 3 is a diagram showing a typical horizontal Ge PD.
Figure 4:
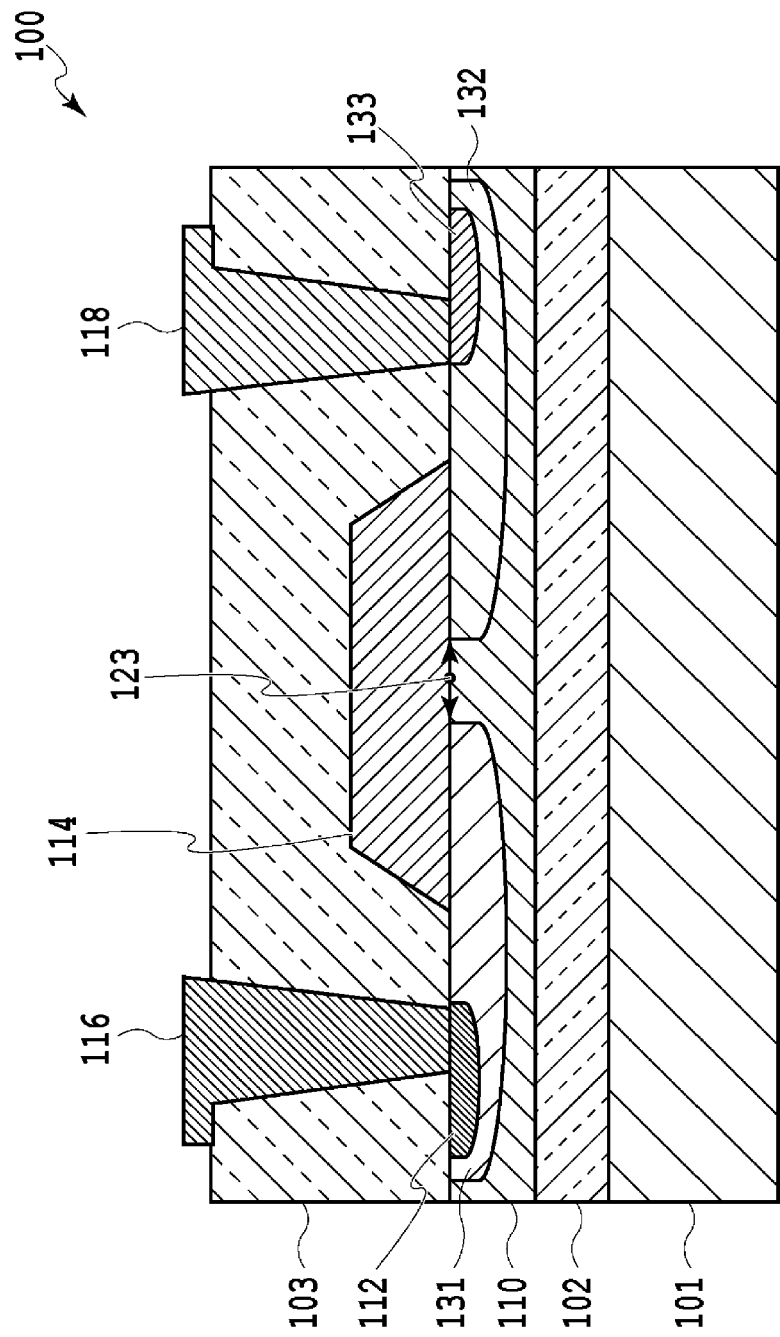
FIG. 4 is a diagram showing a typical horizontal Ge PD.
Figure 5:
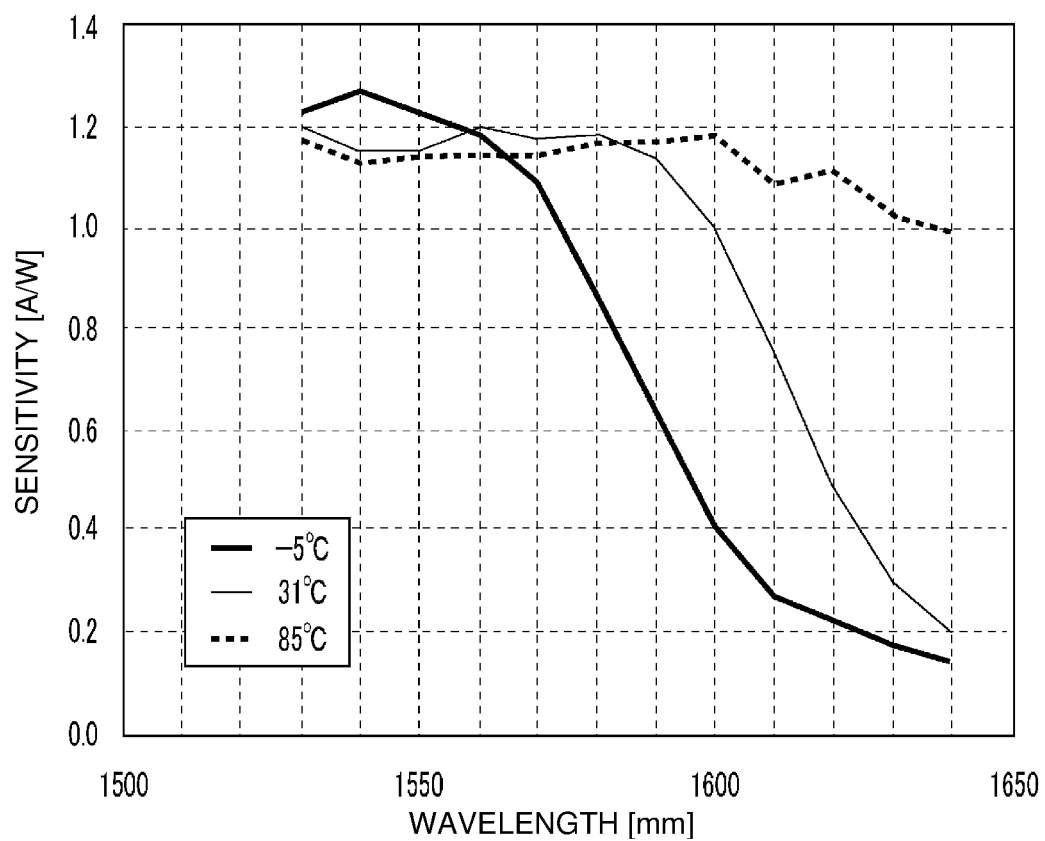
FIG. 5 is a diagram showing temperature- and wavelength-dependence characteristics of sensitivity of a Ge PD.
Figure 6:
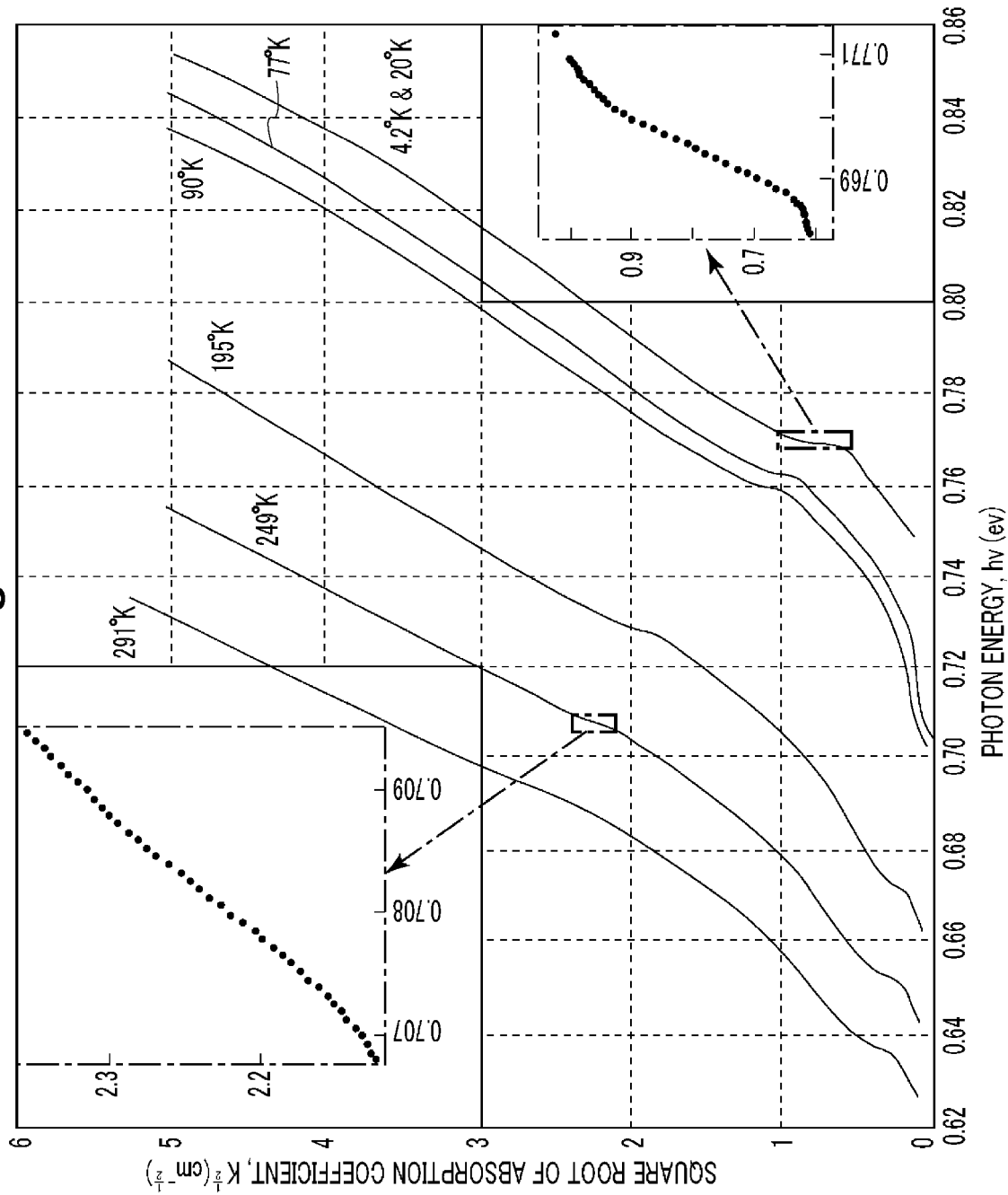
FIG. 6 is a diagram showing temperature-dependence characteristics of a light absorption spectrum of Ge.
Figure 10:
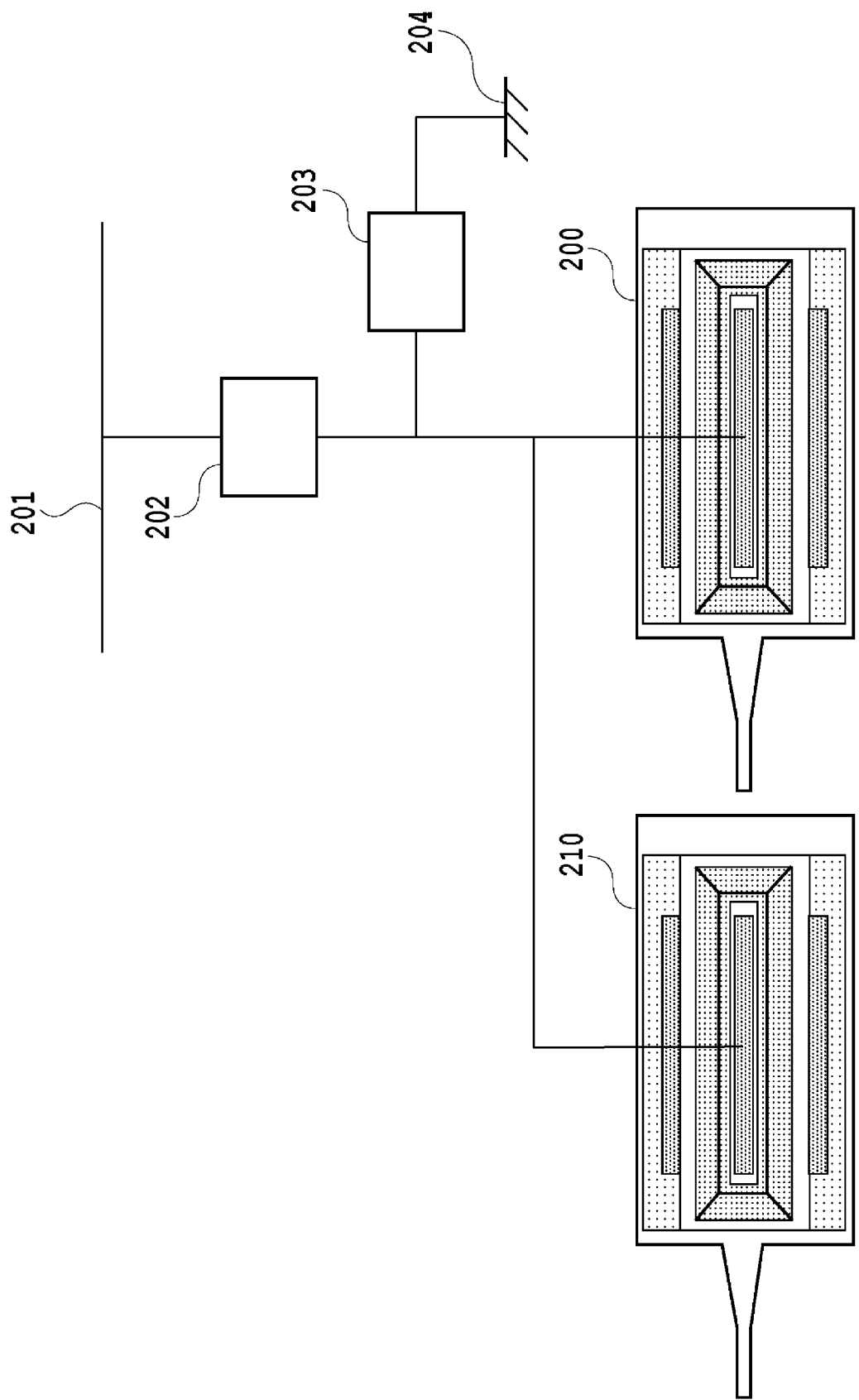
FIG. 10 is a diagram showing a configuration of a photodetector according to a second embodiment.

FIG. 10 is an example in which the resistor 202 is connected to cathodes of two Ge PDs, i.e., a Ge PD 210 and the Ge PD 200, the capacitor 203 is connected to a connection point of the resistor 202 with the Ge PD 210 and Ge PD 200, and the power supply 201 is connected to another end of the resistor 202. Sections of the Ge PDs 210 and 200 may be any of those shown in FIGS. 2 to 4. Signals are taken from the anodes of the Ge PDs 200 and 210. According to the present embodiment, the anode and the cathode may be reversed.

All the cathodes or anodes of the Ge PDs 210 and 200 are interconnected. The resistor 202 receives the total of currents from the Ge PDs 210 and 200, and consequently when photocurrents equal in magnitude flow through the Ge PDs 200 and 210, a voltage drop twice as large as Embodiment 1 occurs. Thus, a design formula is changed to

[Math. 3]

$$RAM = \left(El - \frac{Pbreak}{M\ (PphotoAM1 + PphotoAM2)}\right)\left(\frac{1}{M\ (PphotoAM1 + PphotoAM2)}\right)$$

where PphotoAM1 is the system's maximum optical input power rating for the Ge PD 200 and PphotoAM2 is the system's maximum optical input power rating for the Ge PD 210. When the maximum optical input power rating is the same for the Ge PDs, PphotoAM1=PphotoAM2. Thus,

[Math. 4]

$$RAM = \left(El - \frac{Pbreak}{M\ (2PphotoAM1)}\right)\left(\frac{1}{M\ (2PphotoAM1)}\right)$$

A smaller value of RAM than in the expression of Embodiment 1 is enough.

This similarly applies when three or more Ge PDs are arranged, and the larger the number of Ge PDs, the smaller the resistance value RAM.

This is also true for RM as follows:

[Math. 5]

$$RM = (El - V\_M)\left(\frac{1}{M\ (PphotoM1 + PphotoM2)}\right)$$

When the maximum optical input power rating is the same for the Ge PDs, PphotoM1=PphotoM2. Thus,

[Math. 6]

$$RM = (El - V\_M)\left(\frac{1}{M\ (2PphotoAM1)}\right)$$

When cathode or anode is shared by N PDs, general expressions are as follows:

[Math. 7]

$$RAM = \left(El - \frac{Pbreak}{\sum_{n=1}^{n} M_n\ PphotoAM\_n}\right)\left(\frac{1}{\sum_{n=1}^{n} M_n\ PphotoAM\_n}\right)$$

[Math. 8]

$$RM = (El - V\_M)\left(\frac{1}{\sum_{n=1}^{n} M_n\ PphotoM\_n}\right)$$

where n is the number of standardized PDs, and PphotoAM_n, PphotoM_n, and Mn are the maximum rated optical power, maximum operating optical power, and sensitivity of the Nth PD, respectively.

INDUSTRIAL APPLICABILITY

The present invention is applicable to photodetectors used in optical communications system or optical information processing system.

REFERENCE SIGNS LIST

200 Ge PD
201 Power supply
202 Resistor
203 Capacitor
204 Ground (output port)

The invention claimed is:

1. A photodetector comprising:
   a photodiode including a light absorption layer that contains germanium or a germanium compound;
   a resistor connected in series with a cathode or an anode of the photodiode; and
   a capacitor connected to a connection point between the resistor and the cathode or the anode, another connection point of the resistor being connected to a bias power supply, wherein
   the resistor has a value between resistance values RAM and RM, both inclusive, determined by

[Math. 1]

$$RAM = \left(El - \frac{Pbreak}{M\ Pphoto\_AM}\right)\left(\frac{1}{M\ Pphoto\_AM}\right)$$

[Math. 2]

$$RM = (El - V\_M)\left(\frac{1}{M\ Photo\_M}\right)$$

where R is a resistance value of the resistor, E is an electric field applied to a depletion layer of the photodiode, l is a depletion layer thickness of the photodiode, Pbreak is breakdown power of the photodiode, M is sensitivity of the photodiode, PphotoAM is maximum rated optical input power to the photodiode, PphotoM is maximum operating optical input power to the photodiode, and V_M is a value of voltage applied to the photodiode when maximum operating optical input power is input to the photodiode, and
the electric field E×the depletion layer thickness l has a value between 7 V and 12 V.

2. The photodetector according to claim 1, wherein the electric field E applied to the depletion layer of the photodiode is in a range of 15 to 30 kV/mm.

3. The photodetector according to claim 1, wherein the photodiode includes:
a silicon substrate;
a lower clad layer on the silicon substrate;
a silicon core layer located on the lower clad layer and including a silicon region doped with first conductive impurity ions;
a germanium layer located on the silicon core layer and including a germanium region doped with a second conductive impurities;
an upper clad layer on the silicon core layer and the germanium layer; and
electrodes respectively connected to the silicon region and the germanium region.

4. The photodetector according to claim 3, wherein the resistor and the capacitor contain a metal or a metal compound embedded in the upper clad layer.

5. The photodetector according to claim 1, wherein the photodiode includes:
a silicon substrate;
a lower clad layer on the silicon substrate;
a silicon core layer on the lower clad layer;
a germanium layer located on the silicon core layer and including a germanium region doped with first conductive impurities and a germanium region doped with second conductive impurities;
an upper clad layer on the silicon core layer and the germanium layer; and
electrodes respectively connected to the germanium region doped with the first conductive impurities and the germanium region doped with the second conductive impurities.

6. The photodetector according to claim 1, wherein the photodiode includes:
a silicon substrate;
a lower clad layer on the silicon substrate;
a silicon core layer located on the lower clad layer and including a silicon region doped with first conductive impurity ions and a silicon region doped with second conductive impurity ions;
a germanium layer on the silicon core layer;
an upper clad layer on the silicon core layer and the germanium layer; and
electrodes connected to the respective silicon regions.

7. The photodetector according to claim 1, wherein the resistor and the capacitor contain first conductive impurities or second conductive impurities in a silicon core layer.

8. A photodetector comprising:
two or more photodiodes each including a light absorption layer that contains germanium or a germanium compound, all cathodes or all anodes being interconnected;
a resistor connected in series with the cathodes or the anodes; and
a capacitor connected to a connection point between the resistor and the cathodes or the anodes, another connection point of the resistor being connected to a bias power supply, wherein
the resistor has a value between resistance values RAM and RM, both inclusive, determined by

[Math. 3]
$$RAM = \left(El - \frac{Pbreak}{\sum_{n=1}^{n} M_n \ \text{PphotoAM\_n}}\right)\left(\frac{1}{\sum_{n=1}^{n} M_n \ \text{PphotoAM\_n}}\right)$$

[Math. 4]
$$RM = (El - V\_M)\left(\frac{1}{\sum_{n=1}^{n} M_n \ \text{PphotoM\_n}}\right)$$

where R is a resistance value of the resistor, E is an electric field applied to a depletion layer of each of the photodiodes, l is a depletion layer thickness of each of the photodiodes, Pbreak is breakdown power of each of the photodiodes, V_M is a value of voltage applied to each of the photodiodes when maximum operating optical input power is input to the photodiodes, M1 is sensitivity of a first of the photodiodes, M2 is sensitivity of a second of the photodiodes, as many sensitivities Mn as the number n of photodiodes being defined, PphotoAM_1 is maximum rated optical input power to the first photodiode and PphotoAM_2 is maximum rated optical input power to the second photodiode, as many maximum rated optical input powers PphotoAM_n as the number n of photodiodes being defined, and PphotoM_1 is maximum operating optical input power to the first photodiode and PphotoM_2 is maximum operating optical input power to the second photodiode, as many maximum operating optical input powers PphotoAM_n as the number n of photodiodes being defined, and
the electric field E×the depletion layer thickness l has a value between 7 V and 12 V.

* * * * *